United States Patent [19]
McElroy et al.

[11] Patent Number: 5,177,705
[45] Date of Patent: Jan. 5, 1993

[54] PROGRAMMING OF AN ELECTRICALLY-ERASABLE, ELECTRICALLY-PROGRAMMABLE, READ-ONLY MEMORY ARRAY

[75] Inventors: David J. McElroy, Rosenberg; Sebastiano D'Arrigo, Houston; Manzur Gill, Rosharon; Sung-Wei Lin, Houston, all of Tex.

[73] Assignee: Texas Instruments Incorporated, Dallas, Tex.

[21] Appl. No.: 402,399

[22] Filed: Sep. 5, 1989

[51] Int. Cl.$^5$ .................... G11C 7/00; G11C 16/00
[52] U.S. Cl. ........................... 365/185; 365/189.01; 365/104
[58] Field of Search ............... 365/104, 185, 189.01, 365/189.04, 189.06; 357/23.6, 23.5

[56] References Cited

U.S. PATENT DOCUMENTS

| | | | |
|---|---|---|---|
| 4,412,309 | 10/1983 | Kuo | 365/184 |
| 4,558,344 | 12/1985 | Perlegos | 365/185 X |
| 4,597,000 | 6/1986 | Adam | 365/185 X |
| 4,628,487 | 12/1986 | Smayling | 365/185 |
| 4,642,798 | 2/1987 | Rao | 365/185 X |
| 4,698,787 | 10/1987 | Mukherjee et al. | 365/185 |
| 4,723,225 | 2/1988 | Kaszubinski et al. | 365/185 |
| 4,823,318 | 4/1989 | D'Arrigo et al. | 365/218 X |
| 4,858,194 | 8/1989 | Terada et al. | 365/189.01 X |
| 4,888,735 | 12/1989 | Lee et al. | 365/185 |
| 4,894,802 | 1/1990 | Hsia et al. | 365/185 |

Primary Examiner—Alyssa H. Bowler

[57] ABSTRACT

A method is described for programming an array of EEPROM cells. Programming occurs through a Fowler-Nordheim tunnel window (34) between a source bitline (24) and a floating gate conductor (42) of a selected cell. The voltages applied to the control gate and to the source are selected to differ sufficiently to cause electrons to be drawn through the tunnel window (34) from the source region (24) to the floating gate conductor (42). The non-selected bitlines have a voltage impressed thereon that is of sufficient value to prevent inadvertent programming of cells in the selected row. The non-selected wordlines (48) have a voltage impressed thereon that is of sufficient value to prevent erasing of programmed non-selected cells.

20 Claims, 2 Drawing Sheets

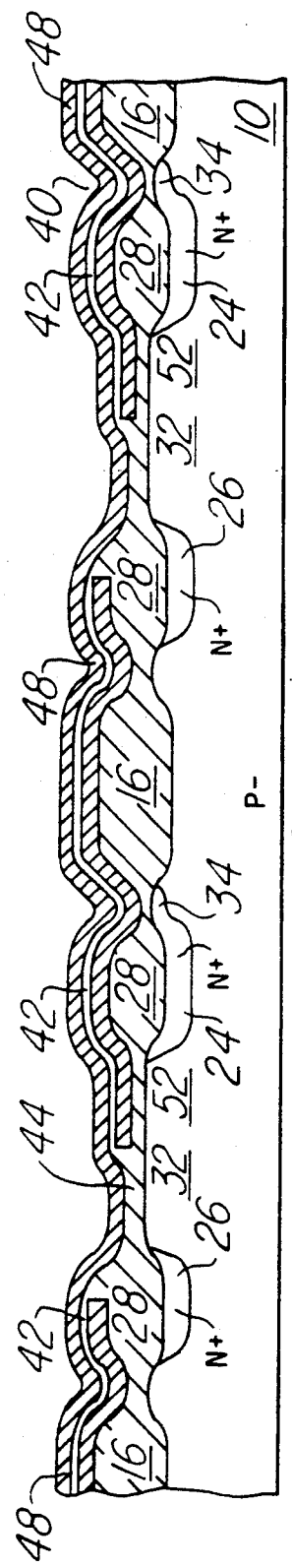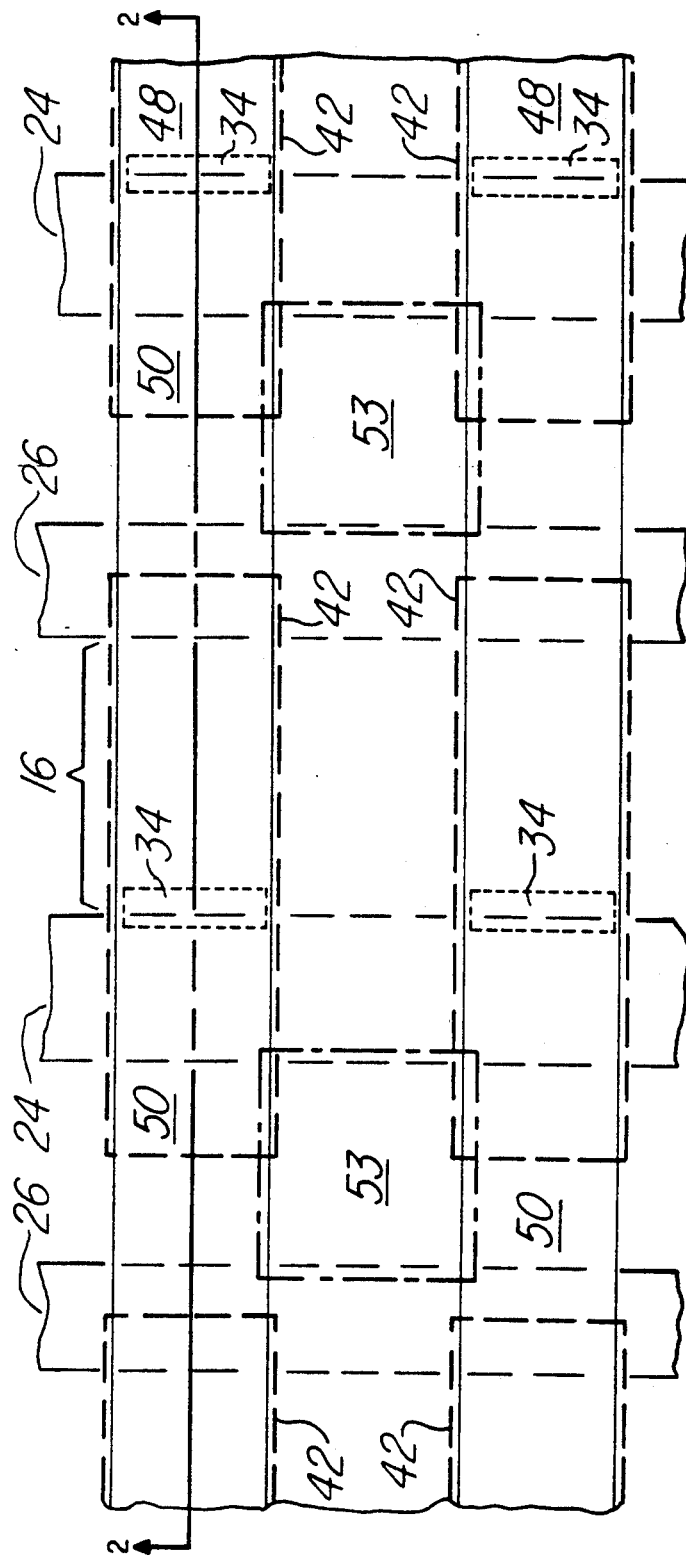

PROGRAMMING OF AN ELECTRICALLY-ERASABLE, ELECTRICALLY-PROGRAMMABLE, READ-ONLY MEMORY ARRAY

RELATED APPLICATIONS

This application is particularly, related to U.S. patent application Ser. No. 07/494,042 filed Mar. 15, 1990, and is further related to co-pending U.S. patent application Ser. Nos. 07/494,060, filed Mar. 15, 1990; 07/494,051, filed Mar. 15, 1990; and 07/374,11, filed Jun. 30, 1989.

BACKGROUND OF THE INVENTION

This invention relates to electrically-erasable, electrically-programmable, read-only-memory arrays, and more particularly to a method for programming such arrays.

EPROMs, or electrically-programmable, read-only-memories, are field-effect devices having a floating-gate-type structure. An EPROM floating gate is programmed by applying proper voltages to the source, drain and control gate of each cell, causing high current to flow through the source-drain path and charging the floating gate by hot electron injection. An EPROM device is erased by ultraviolet light, which requires a device package having a quartz window above the semiconductor chip. Packages of this type are expensive in comparison with the plastic packages ordinarily used for other integrated circuits. One such EPROM device is shown by U.S. Pat. No. 4,750,024, issued to John F. Schreck and assigned to Texas Instruments Incorporated.

EEPROMs, or electrically-erasable, electrically-programmable, read-only-memories, have been manufactured by various processes that usually require a much larger cell size than standard EPROMs and further require more complex manufacturing processes. EEPROMs can however be mounted in opaque plastic packages that reduce the packaging cost. Nevertheless, conventional EEPROMs have, on the whole, been more expensive on a per-bit basis.

More recently, a family of "flash" EEPROMs has been developed that allows an array of cells to be erased in bulk or in blocks instead of each cell being erased individually. Because these EEPROMs may be erased in bulk or in blocks, their cell size can be smaller.

To reduce cell size further and therefore the cost of manufacture, an EEPROM cell integrating a remotely located tunnelling area with a floating-gate transistor has recently been devised. The structural characteristics of the cell and its method of manufacture have been fully disclosed in parent application Ser. No. 07/494,042 and related applications. This application describes and claims a novel method for programming cells of the type disclosed as well as other types of non-volatile memory cells.

Prior-art programming procedures typically require that a preselected first programming voltage be placed on a selected one of a plurality of wordline rows that are spaced apart and formed over respective columns of memory cells. Each of the wordline conductors is insulated from and disposed adjacent to a floating gate conductor of each cell in the respective row. Also, as in prior-art procedures, a second preselected programming voltage that is substantially less positive than the first programming voltage is placed on a selected one of a plurality of elongate semiconductor bitlines formed in columns at an angle to the rows, with a column of memory cells being associated with each bitline. Where the selected wordline conductor intersects the selected bitline, electrons flow through a programming window insulator from the selected bitline to the floating gate conductor in the selected row to program the selected floating gate conductor. The drains of the cells are usually allowed to float.

During such programming, certain of the non-selected memory cells, particularly those in the same row, tend to become programmed. In prior-art memory arrays employing Fowler-Nordheim tunnelling, memory cells using two or three transistors have been used to avoid "write disturb" during programming.

SUMMARY OF THE INVENTION

One aspect of the invention comprises a method for programming an EEPROM cell in an array of such cells in a manner that minimizes the tendency of (i) non-selected, erased cells to be programmed and (ii) non-selected, pre-programmed cells to be erased. A first non-programming voltage that is intermediate between the first and second programming voltages is placed on the remaining, non-selected bitlines of the array prior to applying both programming voltages.

A second non-programming voltage that is also intermediate between the first and second programming voltages, but which may be slightly greater than the first non-programming voltage, is placed on the remaining wordline conductors prior to applying both programming voltages. With the second non-programming voltage applied, the electric potential across the window insulators is insufficient to cause erasing of any previously programmed cells formed at the intersections of the non-selected wordline conductors and the non-selected bitlines. A principal advantage of the invention is that disturbance of the state of non-selected cells is prevented during programming.

The method of this invention is applicable to one-transistor, to split-gate transistor, and to two-transistor memory cell arrays utilizing Fowler-Nordheim tunnelling for programming. Such cells typically have sources and drains isolated from the sources and drains of adjacent cells by field oxide or by electrical means such as field plate isolation.

BRIEF DESCRIPTION OF THE DRAWINGS

The novel features of this invention are set forth in the appended claims. The invention, its features, and its advantages are described below in conjunction with the following drawings:

FIG. 1 is a greatly enlarged sectional view of a portion of an EEPROM array;

FIG. 2 is a plan view of a small portion of an EEPROM array, with the sectional view shown in FIG. 1 taken substantially along line 2—2 of FIG. 2.

DETAILED DESCRIPTION OF THE INVENTION

Figure 3:
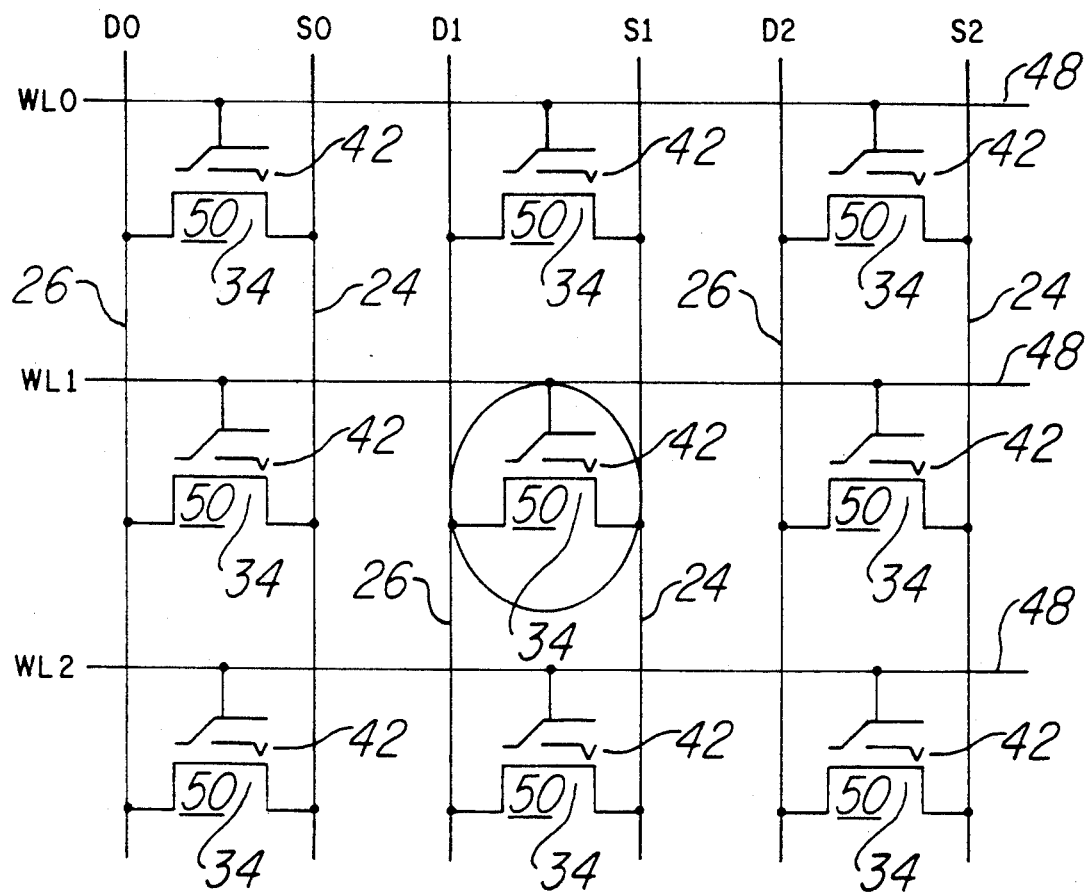
FIG. 3 is a schematic electrical diagram of a small portion of the EEPROM array illustrated in FIGS. 1 and 2, illustrating the programming procedure of this invention.

Referring to FIGS. 1, 2 and 3, and particularly to FIG. 2, a plan view of a small section of an electrically-erasable, electrically-programmable, read-only-memory array is shown. A plurality of memory cells are each shown at 50 and are formed at a face of the semiconductor layer 10 in rows and columns. Each row of cells 50 has diffused into the substrate 10 an elongate bitline or source region 24, buried under a relatively thick oxide region 28. Also diffused into the substrate 10, for each source region 24, is an elongate diffused drain region 26 that runs in parallel in a longitudinal direction to its associated source region 24. Drain region 26 is also buried under a relatively thick oxide region 28.

While regions 24 and 26 are designated herein as source and drain regions, respectively, it should be understood that the designations are interchangeable. It is well known that a particular diffused region may act as a source under one set of electrical connections for one particular operation, yet may act as a drain under another set of electrical connections for another operation. Similarly, the designation of the indicated source lines as bitlines is made solely for the purposes of this explanation, it being understood that the indicated drain lines may serve as bitlines during other operations of the memory arrays of this invention.

For each cell 50, a floating gate conductor 42, identified by a dashed rectangle, is provided. Floating gate 42 is insulated from and disposed over a sub-channel region 52 (FIG. 1) of a respective channel region 32, and is also formed as an elongate horizontal strip extending over the respective source region 24 and extending over the drain region 26 of the next adjacent cell. Each cell 50 further has a tunnel window 34 shown by a dotted outline that is underneath its respective floating gate conductor. Each tunnel window 34 can, for example, be as long as the width of the wordline conductor 48 under which it resides. The tunnel windows may be located adjacent to the channel area, rather than at the illustrated remote location. The tunnel oxide of such tunnel windows is typically on the order of 100 Angstroms in thickness.

The horizontal (as seen in FIG. 2) edges of each floating gate conductor 42 are aligned with a respective wordline conductor 48; the illustrated offset between edges is for the purpose of clarity only. Each row of cells 50 has a wordline conductor 48 extending over and across it in a horizontal direction.

The coupling between the control gate conductor 48 and the respective floating gate conductors 42 is enhanced because each floating gate conductor 42 extends completely across the corresponding bitline 24 and over an oxide isolating area 16 (shown, for example, by the bracket in FIG. 2) as well. Therefore, a larger fraction of the programming/erasing voltages applied to the control gate or wordline conductor 48 on any row of cells 50 will appear between the floating gate conductor 42 and the underlying source or bitline 24. The floating gate conductor is typically spaced from the wordline conductor by an oxide-nitride-oxide insulator layer on the order of 400 Angstroms equivalent oxide thickness.

In one embodiment, an area 53, represented in FIG. 2 as a dashed enclosure, is used to isolate cells 50 from one another in vertical direction. This area 53 may be a thick field oxide layer similar to field oxide regions 16 as shown in FIG. 1. Alternatively, each area 53 may be implanted with a (P) type impurity to provide junction isolation between adjacent wordlines and between channels of cells 50 in the bitline direction.

Although not shown in the FIGS. 1 and 2, a cap oxide and a sidewall oxide may be formed on the exposed polysilicon surfaces to improve data retention.

The operation of the device may be described with the aid of the table set forth immediately below:

TABLE

| | PROGRAM | READ Alt 1 | READ Alt 2 | BLOCK ERASE |
|---|---|---|---|---|
| WL0 | $V_{AUX1}$ | 0 V | 0 V | $V_{EW}$ |
| WL1 | 18 V | 3 V | 3 V | $V_{EW}$ |
| WL2 | $V_{AUX1}$ | 0 V | 0 V | $V_{EW}$ |
| S0 | $V_{AUX2}$ | 0 V | 0 V | 0 V |
| D0 | FLOAT | FLOAT | FLOAT | FLOAT |
| S1 | 0 V | 0 V | 1.5 V | $V_{EB}$ |
| D1 | FLOAT | 1.5 V | 0 V | FLOAT |
| S2 | $V_{AUX2}$ | 0 V | 0 V | 0 V |
| D2 | FLOAT | FLOAT | FLOAT | FLOAT |

VOLTAGE VALUES FOR THE ABOVE TABLE

| | |
|---|---|
| $V_{AUX1}$ | 7 V TO 9 V |
| $V_{AUX2}$ | 6 V TO 7 V |
| $V_{EW}$ | −7 V TO −11 V |
| $V_{EB}$ | 5 V |

The table should be read in conjunction with FIG. 3, which is a schematic electrical diagram of a 3×3 portion of an array of EEPROM cells 50 according to the invention, with like parts being identified by like numbers throughout FIGS. 1–3. Reference may also be made to FIG. 1 for the physical structure involved. While the cells 50 in FIG. 3 are represented by a symbol commonly used for split-gate cells with a Fowler-Nordheim tunnelling window, that type of cell is merely representative of the types of cells that may be used with the method of this invention. Such cells include, for example, one-transistor cells and two-transistor cells.

The first column of the above table is a set of voltages applied to various components of a memory cell 50 located at the center of the mini-array and shown circled in FIG. 3. To program memory cell 50, a first programming voltage in the range of 16 to 18 volts is applied to the selected wordline WL1 as in prior-art programming procedures. The selected source S1 has a second programming voltage of 0 volts applied to it, thereby causing an electric potential from the source region 24 to the wordline conductor 48 of 16 to 18 volts to occur. The length of time that both first and second programming voltages are applied may be, for example, approximately 10 milliseconds. The described cell has a capacitive coupling coefficient of about 0.7 to 0.8 between the wordline conductor 48 and the floating gate conductor 42. Therefore, a programming potential of about 12 to 13 volts can exist between the floating gate conductor 42 and the source region 24. In the EEPROM cell 50 as described, this is sufficient to cause electrons to flow from the source region 24 across the programming window 34 into floating gate conductor 42 by means of Fowler-Nordheim tunneling through an oxide of about 100A. thickness.

During programming, the drain D1 associated with the source S1 may be allowed to float, allowing no drain-to-source current in the cell 50 that is being programmed.

In accordance with this invention, the non-selected source regions S0 and S2 are held, previous to the application of both first and second programming voltages, at a first non-programming voltage $V_{AUX2}$ that is between the first and second programming voltage values. In the illustrated embodiment, the $V_{AUX2}$ voltage is chosen within the range of 6 to 7 volts. After capacitive coupling has been taken into account, the difference in potential between the floating gate conductor 42 and the nonselected source regions 24 of the non-selected cells 50 connected to selected wordline WL1 is only about 6 to 7 volts during programming, which is insufficient to cause Fowler-Nordheim tunneling across the tunnel oxide windows 34 of those non-selected cells 50. The first non-programming voltage $V_{AUX2}$ may be removed from the non-selected bitlines after programming of the selected bit.

Many of the non-selected cells 50 have floating gate conductors 42 that may have been previously programmed. Each such previously programmed cell has a negative voltage in the range of −2 to −4 volts residing thereon. Because each of the non-selected source regions or bitlines S0 and S2 has 6 to 7 volts ($V_{AUX2}$) impressed thereon, and because a significant electric potential of about 8 to 11 volts may exist across the tunnel oxide windows 34 of these non-selected but programmed cells, the programmed cells may be inadvertently erased or partially erased. To counteract this "bitline stress" condition, the non-selected wordlines WL0 and WL2 have a second non-programming voltage $V_{AUX1}$ previously impressed thereon, the voltage $V_{AUX1}$ acting to dilute the electric field across the tunnel oxide windows 34. This voltage $V_{AUX1}$ is also selected to be between the first and second programming voltages, and may be slightly greater than the first non-programming voltage. In the illustrated embodiment, this $V_{AUX1}$ voltage is selected in the range of 7 to 9 volts. The second non-programming voltage $V_{AUX1}$ may be removed from the non-selected wordlines after programming of the selected bit.

The voltages given as examples above are relative to a reference voltage taken, for example, as the voltage at selected cell bitline S1 of the array. If, also for example, the voltage at selected wordline WL1 of the array is the reference voltage, then the first programming voltage is 0 volts and the second programming voltage is −18 volts, with other voltages adjusted accordingly.

The second column of the table describes the voltages applied to various components of the cell 50 when it is desired to be read. There are two alternatives given under respective column headings Alt 1 and Alt 2. According to Alt 1 reading method, the deselected wordlines WL0 and WL2 have zero volts impressed thereon, such that the sub-channels 44 (FIG. 1) are nonconductive and such that there is little or no drain to source current. A relatively small positive voltage of 3 volts is impressed on the selected wordline WL1 to cause the sub-channel or pass gate 44 of the selected cell to be conductive. The deselected drain bitlines D0 and D2 are allowed to float, while a potential of 0 volts is applied to each of the sources S0–S2. The drain bitline D1 of the selected cell has a voltage $V_{DD}$ of 1.5 volts impressed thereon to create a potential difference between the selected drain and the selected source.

If a negative charge resides on the floating gate conductor 42 of the selected cell, the sub-channel 52 (FIG. 1) will be rendered nonconductive, and a logic "zero" will be sensed at the selected drain line 26. If, on the other hand, a positive charge resides on the floating gate conductor 42, the sub-channel 52 will be conductive. Since the sub-channel 44 is also 10 conductive, current will be sensed at the selected drain line 26 (FIG. 1) as a logic "1".

The second reading alternative, Alt 2, is similar to the first except that the selected source S1 has 1.5 volts placed thereon and the "1" or "0" bit is read at the source S1.

The third column of the table sets forth the voltages for a block erase. The selected block is a column of bits (column S1–D1 of FIG. 3). All the wordlines have an erasing voltage $V_{EW}$ impressed thereon, while all of the selected sources S1 have a second erasing voltage $V_{EB}$ placed thereon. The combination of $V_{EW}$ and $V_{EB}$ produces an electric field adequate for erase. The non-selected sources are held at ground so that the electric field from $V_{EW}$ alone is insufficient to cause erasure of the non-selected block. All drains D0–D2 are allowed to float.

In summary, a novel method of programming an EEPROM cell has been shown and described. Although the illustrated cell has a floating gate integrated with a pass gate between the source and drain, the concept of this invention applies equally to cells without such pass gates.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

What is claimed is:

1. A method for programming a selected memory cell in an array of said cells, said selected memory cell connected to a selected wordline and a selected bitline, said array containing at least a first non-selected memory cell connected to said selected wordline and to a non-selected bitline, said method comprising:

preselected first and second programming voltages such that said first programming voltage is substantially more positive than said second programming voltage and preselecting a first non-programming voltage, said first non-programming voltage having a value between said first and second programming voltages, said value preselected to prevent programming of said first non-selected cell;

applying said first programming voltage to said selected wordline;

applying said second programming voltage to said selected bitline;

prior to and during application of said first and second programming voltages, applying said first non-programming voltage to said non-selected bitline.

2. The method of claim 1, said array including at least a second non-selected memory cell, said second non-selected memory cell connected to said non-selected bitline and to a non-selected wordline, wherein prior to and during application of said first and second programming voltages, a second non-programming voltage is applied to said non-selected wordline, said second non-programming voltage having a value between said first and second programming voltages, said second non-programming voltage being preselected to prevent at least partial erasure of said second non-selected memory cell.

3. The method of claim 2, wherein said second non-programming voltage is preselected to be in the approximate range of 7 to 90 volts.

4. The method of claim 1, wherein the sources of all of said memory cells in said array are connected to at least one of said selected and non-selected bitlines and wherein the drains of all of said memory cells in said array are allowed to float during said applications of said first and second programming voltages.

5. The method of claim 1, wherein said step of preselecting the first and second programming voltages comprises selecting said first programming voltage to be approximately 18 volts and selecting said second programming voltage to be 0 volts.

6. The method of claim 1, said selected cell including a floating gate insulated from said selected wordline and from said selected bitline, wherein said step of preselecting said first and second programming voltages comprises the steps of:

selecting said first programming voltage to be approximately 0 volts; and selecting said second programming voltage to be at least a negative potential sufficient to cause electrons to flow from said selected bitline to said floating gate.

7. The method of claim 6, wherein said step of preselecting said second programming voltage comprises the step of selecting the second programming voltage to be approximately −18 volts.

8. The method of claim 1, wherein said first non-programming voltage is preselected to be in the approximate range of 6 to 7 volts.

9. The method of claim 1, wherein the source of said selected memory cell is connected to said selected bitline and wherein the drain of said selected memory cell is allowed to float during application of said first and second programming voltages.

10. The method of claim 1, wherein said preselected memory cell and said first non-selected memory cell have programming windows comprising a layer of silicon dioxide on the order of 100 Angstroms thick.

11. The method of claim 1, wherein said first and second programming voltages are applied simultaneously.

12. The method of claim 1, wherein said second non-programming voltage is applied prior to application of said first non-programming voltage.

13. A method for programming a selected memory cell in an array of such cells, said selected memory cell connected to a selected wordline and a selected bitline, said array including a first non-selected memory cell connected to said selected wordline and to a non-selected bitline, said array including a second non-selected memory cell connected to said non-selected bitline and to a non-selected wordline, said method comprising:

preselecting first and second programming voltages such that said second voltage is substantially less positive than said first, preselecting first and second non-programming voltages between said first and second programming voltages, said first non-programming voltage preselected to prevent programming of said first non-selected memory cell, said second non-programming voltage preselected to prevent erasing said second non-selected memory cell;

applying said first programming voltage to said selected wordline;

applying said second programming voltage to said selected bitline;

applying said first non-programming voltage to at least said non-selected bitline, applying said second non-programming voltage to at least said non-selected wordline;

wherein said first and second non-programming voltages are applied before and during simultaneous application of said first and second programming voltages.

14. The method of claim 13, and further comprising the steps of:

preselecting said first programming voltage to be approximately 0 volts; and preselecting said second programming voltage to be a negative voltage.

15. The method of claim 13, and further comprising the step of preselecting said second programming voltage to be approximately −18 volts.

16. The method of claim 13, wherein said first non-programming voltage is preselected to be in the approximate range of 6 to 7 volts.

17. The method of claim 13, wherein said second non-programming voltage is preselected to be in the approximate range of 7 to 9 volts.

18. The method of claim 13, wherein said selected memory cell and said first and second non-selected memory cells have programming windows having a thickness of approximately 100 Angstroms.

19. The method of claim 13, wherein said non-selected bitline is connected to the sources of said first and second non-selected memory cells and wherein the drains of said first and of said second non-selected memory cells are allowed to float.

20. The method of claim 13, and further comprising the steps of:

preselecting said first programming voltage to be about 18 volts; and preselecting said second programming voltage to be 0 volts.

* * * * *